(12) United States Patent
Houston (10) Patent No.: US 7,755,924 B2
(45) Date of Patent: Jul. 13, 2010

(54) SRAM EMPLOYING A READ-ENABLING CAPACITANCE

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 124 days.

(21) Appl. No.: 11/969,636

(22) Filed: Jan. 4, 2008

(65) Prior Publication Data

US 2009/0175067 A1 Jul. 9, 2009

(51) Int. Cl.
*G11C 11/24* (2006.01)
(52) U.S. Cl. .................. 365/149; 365/154; 365/156
(58) Field of Classification Search .............. 365/149, 365/154, 156
See application file for complete search history.

(56) References Cited

U.S. PATENT DOCUMENTS 4,809,226 A * 2/1989 Ochoa, Jr. .................. 365/156
5,311,070 A * 5/1994 Dooley ....................... 327/208
5,541,427 A * 7/1996 Chappell et al. ............ 257/306
5,644,155 A * 7/1997 Lien ........................... 257/401
5,905,290 A * 5/1999 Houston ..................... 257/380
6,369,630 B1 * 4/2002 Rockett ...................... 327/210
6,944,042 B2 * 9/2005 Komatsuzaki ............... 365/145
7,064,574 B1 * 6/2006 Voogel et al. ................ 326/9
7,110,281 B1 * 9/2006 Voogel et al. ............... 365/149
7,301,796 B1 * 11/2007 Voogel et al. ............... 365/149

OTHER PUBLICATIONS

Houston, Theodore W., et al., U.S. Appl. No. 11/969,589; filed Jan. 4, 2008; entitled, "Feedback Structure for an SRAM Cell."

* cited by examiner

*Primary Examiner*—Viet Q Nguyen
(74) *Attorney, Agent, or Firm*—Rose Alyssa Keagy; W. James Brady; Frederick J. Telecky, Jr.

(57) ABSTRACT

Embodiments of the present disclosure provide a memory element, a method of constructing a memory element, a method of operating a memory cell, an SRAM cell and an integrated circuit. In one embodiment, the memory element includes a pair of cross-connected CMOS inverters having first and second storage nodes. Additionally, the memory element also includes a capacitive component connected between the first and second storage nodes and configured to provide a supplemental capacitance to extend a read signal for sensing a memory state of the inverters.

38 Claims, 10 Drawing Sheets

SRAM EMPLOYING A READ-ENABLING CAPACITANCE

TECHNICAL FIELD

The present disclosure is directed, in general, to semiconductor memory and, more specifically, to a memory element, methods of constructing a memory element and operating a memory cell and an SRAM cell or an integrated circuit employing the memory element or the methods.

BACKGROUND

A typical SRAM is designed to store many thousands of bits of information. These bits are stored in individual cells, organized in rows and columns to make efficient use of space on a semiconductor substrate containing the SRAM device. A commonly used cell architecture is known as the "6T" cell, by virtue of having six MOS transistors. Four transistors defining an SRAM cell core or memory element are configured as cross-coupled CMOS inverters, which act as a bistable circuit that indefinitely holds the state imposed onto it while powered. Each CMOS inverter includes a load or "pull-up" transistor and a driver or "pull-down" transistor. The output of the two inverters will be in opposite states, except during transitions from one state to another. Two additional transistors are known as "pass gate" transistors, which provide access to the cross-coupled inverters during a read operation (herein referred to as READ) or write operation (herein referred to as WRITE). The gate inputs of the pass transistors are typically connected in common to a "word line". The drain of one pass gate transistor is connected to a "bit line", while the drain of the other pass gate transistor is connected to the logical complement of the bit line. Although present memory systems provide acceptable performance, further improvements that provide more stable operating characteristics would be beneficial in the art.

SUMMARY

Embodiments of the present disclosure provide a memory element, a method of constructing a memory element, a method of operating a memory cell, an SRAM cell and an integrated circuit. In one embodiment, the memory element includes a pair of cross-connected CMOS inverters having first and second storage nodes. Additionally, the memory element also includes a capacitive component connected between the first and second storage nodes and configured to provide a supplemental capacitance to extend a read signal for sensing a memory state of the inverters.

In another aspect, the present disclosure provides a method of constructing a memory element. The method includes providing first and second storage nodes with a pair of cross-connected CMOS inverters and adding a supplemental capacitance between the first and second storage nodes that delays an upset of the inverters to allow reading an initial memory state of the inverters.

In an additional aspect, the present disclosure provides a method of operating a memory cell. The method includes providing a memory state with first and second storage nodes of cross-coupled CMOS inverters and extending a read signal for sensing the memory state by connecting a supplemental capacitance between the first and second storage nodes. The method also includes connecting first and second bit lines to the first and second storage nodes to provide the read signal.

The present disclosure also provides, in yet another aspect, an SRAM cell. The SRAM cell includes a memory element having a pair of cross-connected CMOS inverters with first and second storage nodes. The memory element also has a capacitive component connected between the first and second storage nodes that provides a supplemental capacitance to extend a read signal for sensing a memory state of the inverters. The SRAM cell also includes first and second pass-gate MOS transistors that are controlled by a word line and respectively connected between the first and second storage nodes and first and second bit lines.

The present disclosure further provides, in yet another aspect, an integrated circuit. The integrated circuit includes a timing control unit, row and column decoders coupled to the timing control unit, word line drivers coupled to the row decoders, sense amplifiers, first and second bit line with precharge circuits and write drivers coupled to the column decoders, and a memory array having a memory cell corresponding to a bit position for each intersecting row and column. The memory cell includes a pair of cross-connected CMOS inverters with first and second storage nodes and a capacitive component connected between the first and second storage nodes that provides a supplemental capacitance to extend a read signal for sensing a memory state of the inverters by the sense amplifiers. The memory cell also includes first and second pass-gate MOS transistors that are controlled by a corresponding one of the word line drivers and respectively connected between the first and second storage nodes and corresponding first and second bit lines.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

Typically, in a read operation with an SRAM array, the bit lines are precharged HIGH, the word line is turned ON, and the LOW storage node of the accessed cell pulls the associated bit line LOW establishing a differential voltage between bit lines. At the same time, the charge on the precharged-high bit line raises the voltage of the storage node. That is, as the LOW storage node is pulling the bit line LOW, the LOW storage node itself is being pulled HIGH by the charge on the bit line. If there is imbalance in the cell, this pulling HIGH of the LOW storage node may cause the SRAM cell to upset (i.e., flip to the other memory state). Even if the cell is upset, there will be an initial differential voltage established on the bit lines that reflects the initial state of the SRAM cell. However, if the SRAM cell flips quickly, the initial differential established on the bit lines may be inadequate for sensing.

The rate at which an SRAM cell upsets (i.e., loses its stored information) as its associated word line is turned ON may be slowed down by adding a capacitance to each storage node of the SRAM cell. There is an amplification of the effectiveness of this capacitance if it is added between the storage nodes of the SRAM cell, due to the Miller effect. Along with the slow down of the cell upset, a timing window for sensing the stored information is increased for a READ from the cell. Additionally, a Read signal magnitude (i.e., the differential voltage on the bit lines, or the change in voltage of a single bit line) on an associated bit line is also increased for the READ. The added capacitance will also slow down a WRITE to the cell, but the WRITE may still be made faster than the READ.

Currently, SRAM cells are designed statically. That is, they are designed for stability under the condition where the bit lines are fixed at a precharge value. Additionally, some SRAM cells employ an added capacitance to improve radiation hardness or general stability of the cell to avoid their being upset under static conditions. Embodiments of the present disclosure employ a supplemental capacitance selected to enhance the ability to accomplish a valid READ from the cell before it upsets by considering the dynamic effect of the bit line's response on the cell. Additionally, dynamic word line effects are also discussed.

Figure 1:
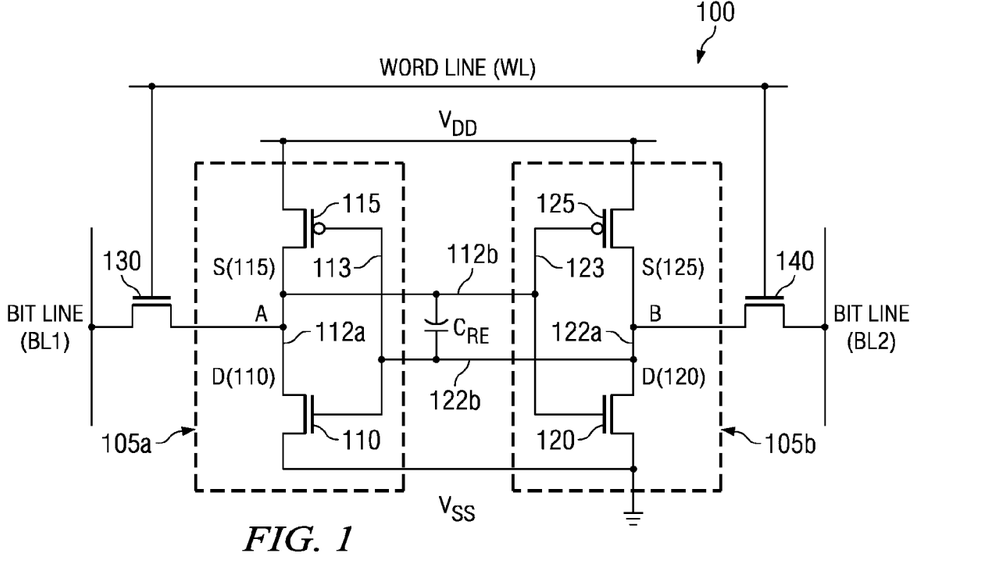
FIG. 1 illustrates an embodiment of an integrated circuit 6T SRAM cell constructed according to the principles of the present disclosure.

FIG. 1 illustrates an embodiment of an integrated circuit 6T SRAM cell 100 constructed according to the principles of the present disclosure. The 6T SRAM cell 100 includes a pair of CMOS inverters consisting of first and second CMOS inverters 105a, 105b. The first CMOS inverter 105a includes first pull-down and pull-up transistors 110, 115 having a first storage node A provided by a first interconnect 112a that electrically connects a first drain D(110) to a second drain D(115), as shown. Correspondingly, the second CMOS inverter 105b includes second pull-down and pull-up transistors 120, 125 having a second storage node B provided by a second interconnect 122a that electrically connects a third drain D(120) to a fourth drain D(125), as also shown.

The first CMOS inverter 105a also includes a first gate structure 113 that electrically connects the gates of the first pull-down and pull-up transistors 110, 115 together. Correspondingly, the second CMOS inverter 105b includes a second gate structure 123 that electrically connects the gates of the second pull-down and pull-up transistors 120, 125 together. A first gate contact 112b electrically connects the first interconnect 112a to the second gate structure 123, and a second gate contact 122b electrically connects the second interconnect 122a to the first gate structure 113. These connections allow the first and second CMOS inverters 105a, 105b to function as a memory element.

The 6T SRAM cell 100 also includes first and second pass-gate MOS transistors 130, 140 that are controlled by a word line WL and are respectively connected between the first storage node A and a first bit line BL1 and the second storage node B and a second bit line BL2. Operation of the 6T SRAM cell 100 to store and retrieve data is well known to one skilled in the pertinent art.

The 6T SRAM cell 100 further includes a capacitive component $C_{RE}$ connected between the first and second storage nodes A, B that provides a supplemental capacitance sufficient to extend a Read signal for sensing a memory state of the first and second CMOS inverters 105a, 105b. The Read signal is a voltage or current imposed on a sense line (generally a bit line) indicating the state of the memory element being read. Generally, the supplemental capacitance ranges from about one to two percent of an associated bit line capacitance. In the illustrated embodiment, the supplemental capacitance ranges from about 0.2 to 0.5 femtofarads with an associated bit line capacitance of about 25 femtofarads.

The effectiveness of the supplemental capacitance in extending the read signal is related to the ratio of the supplemental capacitance to the bit line capacitance with a larger ratio being more effective. Although a larger supplemental capacitance is more effective, the negative impact of the larger supplemental capacitance on write speed also needs to be taken into account in selecting the magnitude of the supplemental capacitance. Additionally, it may be desirable to limit the bit line capacitance.

The supplemental capacitance extends the Read signal to permit sensing the memory state prior to the memory state being upset. As will be discussed in more detail, the supplemental capacitance extends the Read signal in both duration and amplitude as it delays the upset of the 6T SRAM cell 100, wherein one embodiment provides at least a 100 picosecond period above a level of 100 millivolts. In one embodiment, the supplemental capacitance and associate bit line capacitance are chosen to provide an adequate Read signal prior to upset of the cell. In another embodiment, the supplemental capacitance and associated bit line capacitance are chosen in conjunction with a pulsed word line architecture such that an adequate Read signal is generated during the limited time in which the word line is ON and the cell is not upset.

Figure 2:
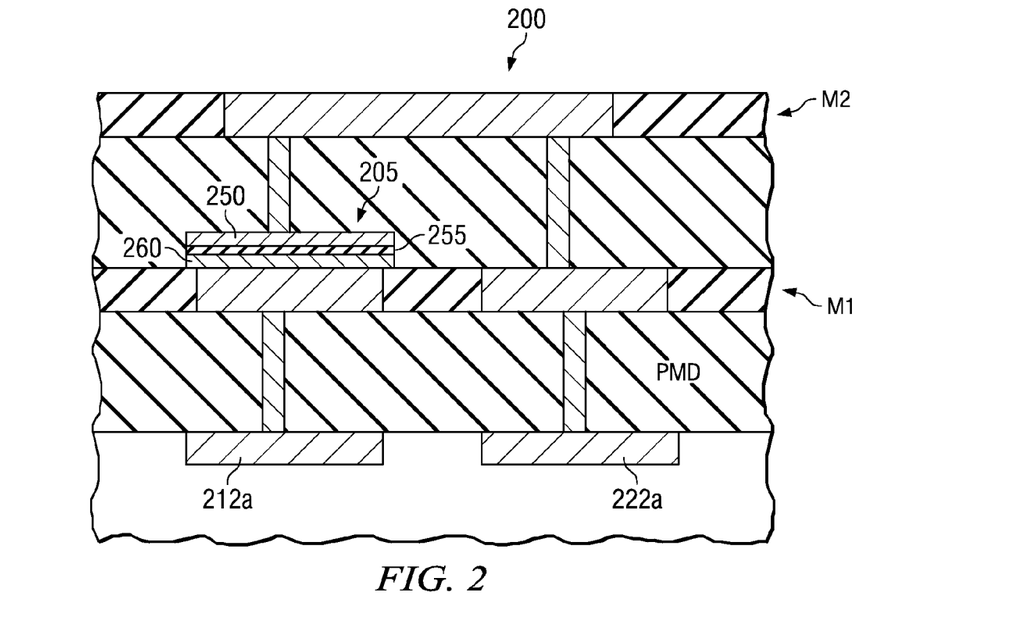
FIG. 2 illustrates an embodiment of a capacitive component as may be employed in the 6T SRAM cell of FIG. 1.

FIG. 2 illustrates an embodiment of a capacitive component 200 as may be employed in the 6T SRAM cell 100 of FIG. 1. In this embodiment, the capacitive component 200 is actually a single metal-insulator-metal (MIM) capacitor 205 having first and second conductive layers 250, 260 separated by an insulating layer 255. The single capacitor 205 provides an effective and straightforward approach for obtaining supplemental capacitance. However, it requires two levels of routing (i.e., two metallization layers M1, M2 located over the first and second storage nodes A, B) to connect the first and second conductive layers 250, 260 to first and second interconnects 212a, 222a that correspond to the first and second storage nodes A, B.

Figure 3A:
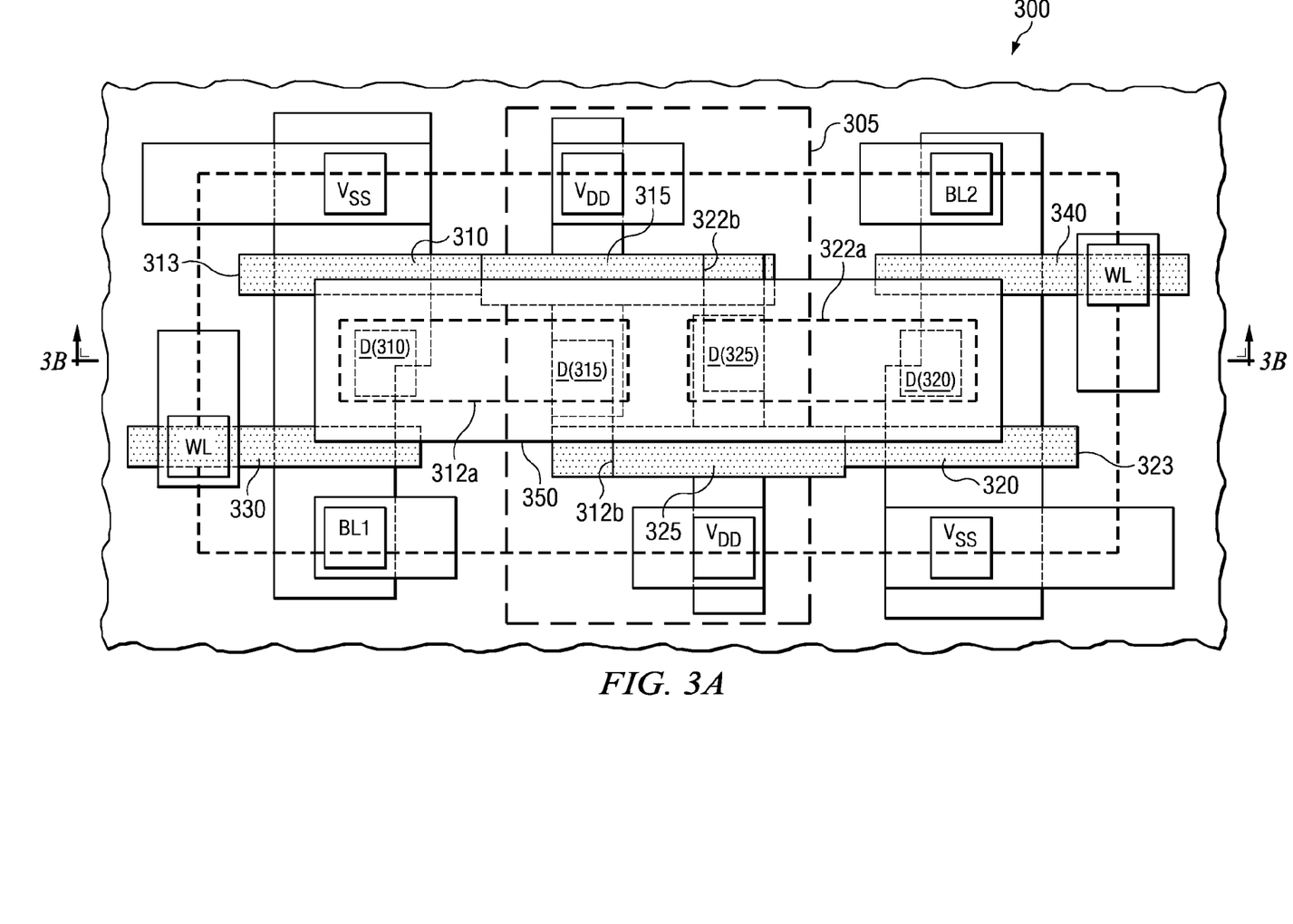
FIGS. 3A and 3B illustrate an example of a physical layout corresponding to the 6T SRAM cell of FIG. 1 and employing an embodiment of a capacitive component constructed according to the principles of the present disclosure.
Figure 3B:
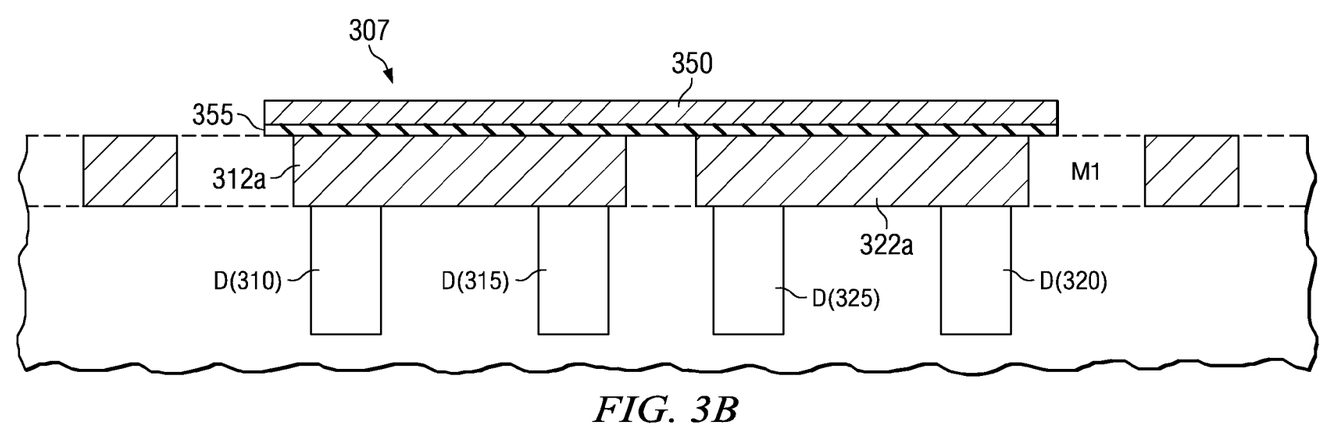

FIGS. 3A and 3B illustrate an example of a physical layout 300 corresponding to the 6T SRAM cell 100 of FIG. 1 and employing an embodiment of a capacitive component $C_{RE}$ constructed according to the principles of the present disclosure. The physical layout 300 employs a p-type substrate and, for clarity, focuses only on transistor active and gate structures. The layout of the bit lines, word line and power supply lines may follow standard procedures familiar to one that is skilled in the pertinent art. The capacitive component $C_{RE}$ in the physical layout 300 employs a series-capacitance structure 307 to provide a supplemental capacitance for read enhancement of the 6T SRAM cell 100.

The illustrated embodiment of the first and second CMOS inverters 105a, 105b employ first and second n-type MOS pull-down transistors 310, 320 that are connected to corresponding first and second p-type MOS pull-up transistors 315, 325. The first and second n-type MOS pull-down transistors 310, 320 are formed in and on the p-type substrate. The corresponding first and second p-type MOS pull-up transistors 315, 325 are formed in and on an n-well 305 contained in the p-type substrate.

Gates of the first pull-down and pull-up MOS transistors 310, 315 have a first common gate structure 313 wherein they are connected using a single strip of gate material (e.g., polysilicon). Similarly, gates of the second pull-down and pull-up MOS transistors 320, 325 have a second common gate structure 323. Active and gate structures are also shown for the first and second pass-gate MOS transistors 330, 340.

A first interconnect 312a electrically connects the drain D(310) of the first pull-down MOS transistor 310 to the source S(315) of the first pull-up MOS transistor 315. A first gate contact 312b provides further electrical connection to the second common gate structure 323 thereby forming a first portion of a memory element. Similarly, a second interconnect 322a electrically connects the drain D(320) of the second pull-down MOS transistor 320 to the source S(325) of the second pull-up MOS transistor 325. A second gate contact 322b provides further electrical connection to the first common gate structure 313 thereby completing connection of the memory element. FIG. 3B, which is a first sectional view, provides improved clarity of these interconnections for the first and second local interconnects 312a, 322a.

The illustrated embodiment of the capacitive component $C_{RE}$ provides a supplemental capacitance corresponding to the series-capacitance structure 307 having a first metallization portion (the first local interconnect 312a) and a second metallization portion (the second local interconnect 322a) within a metallization layer M1, as clearly shown in FIG. 3B. These, of course, respectively connect first and second drain contacts to provide the first and second storage nodes A, B. A common conductive layer 350 is constructed over the metallization layer M1 that is electrically insulated from the first and second metallization portions with an insulating layer 355.

The series-capacitance structure 307 effectively provides two capacitors that are connected in series and a corresponding supplemental capacitance that is approximately half of that provided by each capacitor. However, this construction efficiently employs only one metallization layer.

Figure 4A:
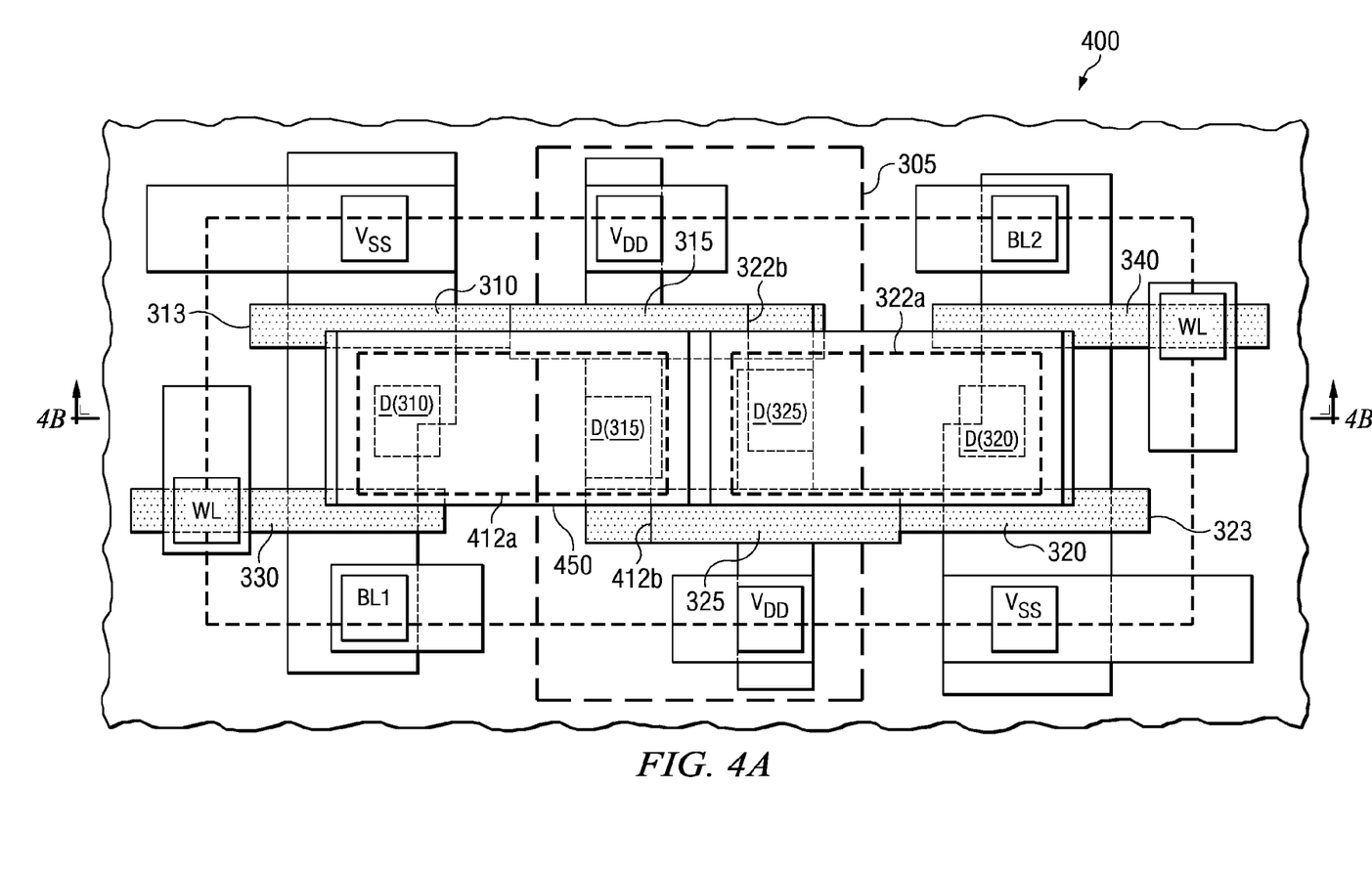
FIGS. 4A and 4B illustrate a physical layout corresponding to the 6T SRAM cell of FIG. 1 and employing another embodiment of a capacitive component constructed according to the principles of present disclosure.
Figure 4B:
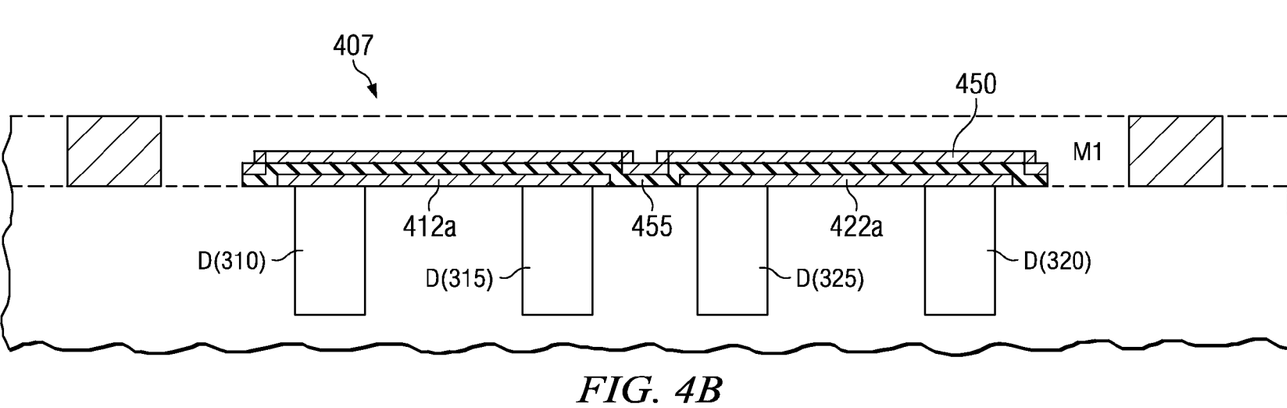

FIGS. 4A and 4B illustrate a physical layout 400 corresponding to the 6T SRAM cell 100 of FIG. 1 and employing another embodiment of a capacitive component $C_{RE}$ constructed according to the principles of present disclosure. The physical layout 400 employs many of the basic layout components of FIG. 3A as shown, and the discussion of these components with respect to FIG. 3A may also be applied to FIG. 4A. However, the capacitive component $C_{RE}$ is a different embodiment and will be the focus of discussion for FIGS. 4A and 4B. As before, FIG. 4B represents a sectioned view.

In this embodiment, the capacitive component $C_{RE}$ provides a supplemental capacitance corresponding to a series-capacitance structure 407 located in a metallization layer M1. The series-capacitance structure 407 employs first and second conductive layers 412a, 422a respectively connected to the first drain and source D(310), S(315) and the second drain and source D(320), S(325) to form the first and second storage nodes A, B. A common conductive layer 450 is constructed to be electrically insulated by an insulation layer 455 over the first and second conductive layers 412a, 422a. As before, this embodiment provides an efficient construction employing space normally occupied by metallization.

Figure 5A:
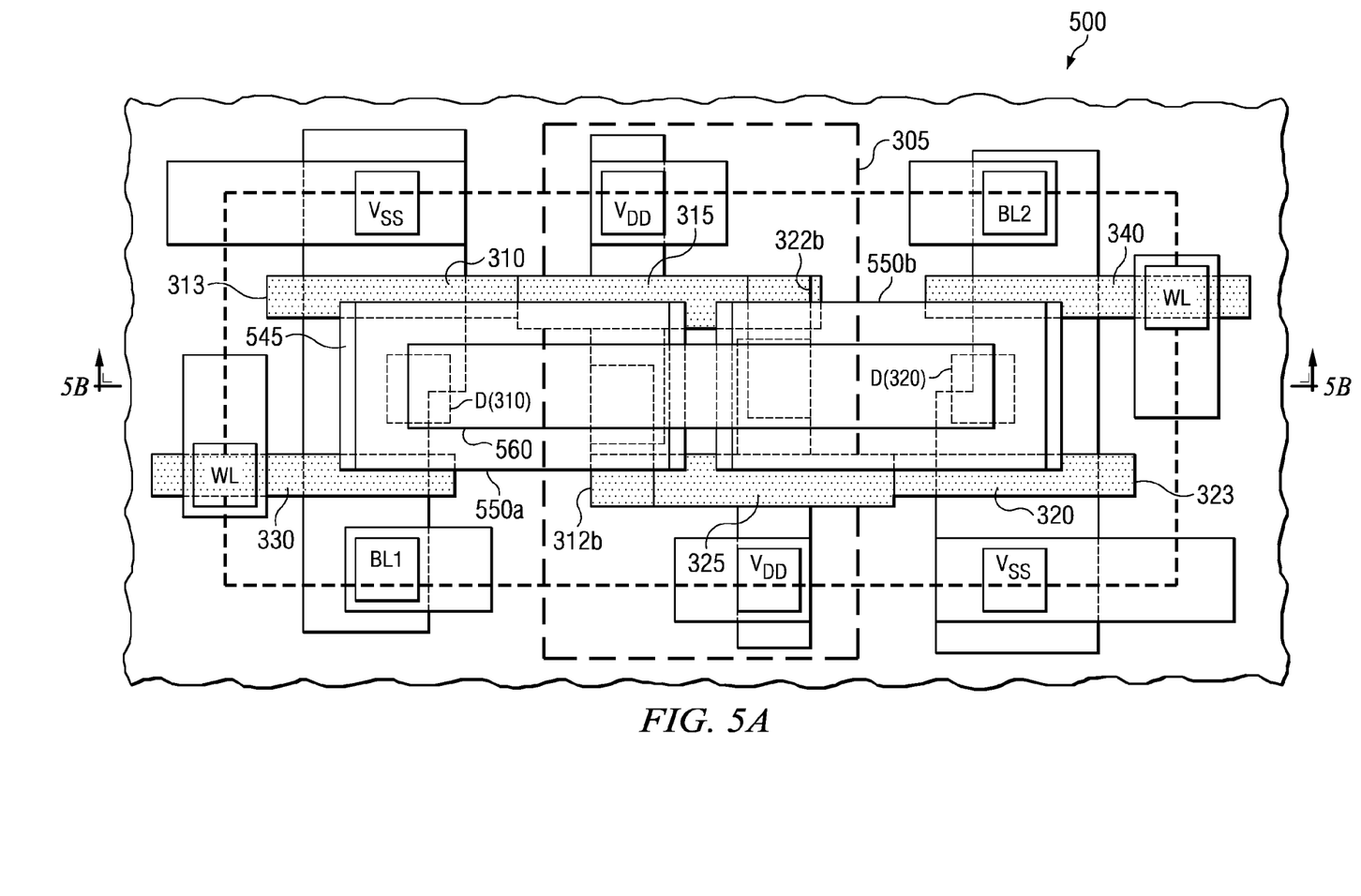
FIGS. 5A and 5B illustrate a physical layout corresponding to the 6T SRAM cell 100 of FIG. 1 and employing yet another embodiment of a capacitive component constructed according to the principles of present disclosure.
Figure 5B:
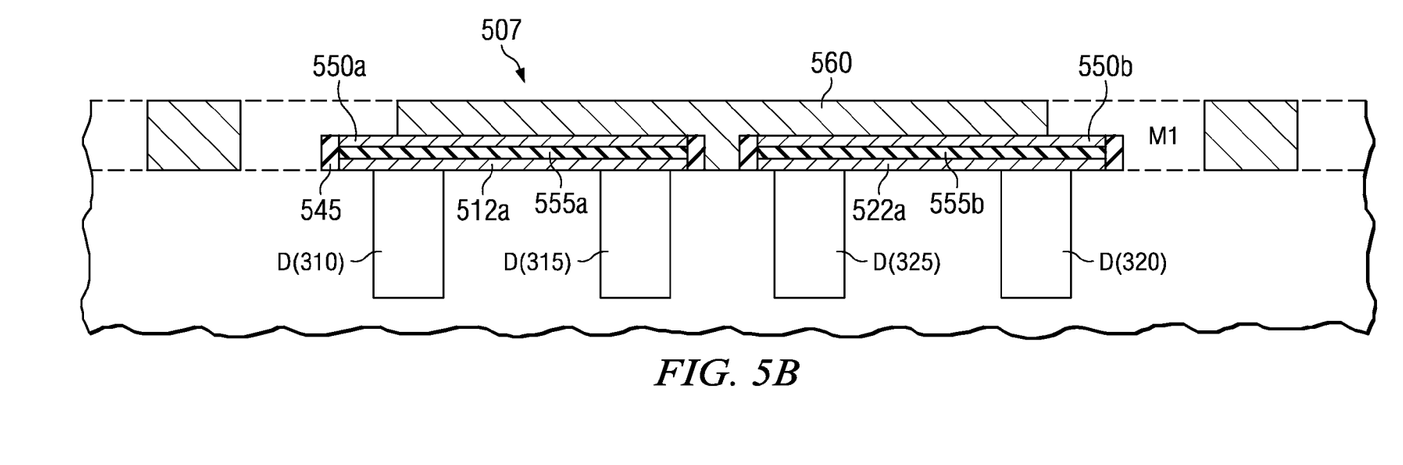

FIGS. 5A and 5B illustrate a physical layout 500 corresponding to the 6T SRAM cell 100 of FIG. 1 and employing yet another embodiment of a capacitive component $C_{RE}$ constructed according to the principles of present disclosure. The physical layout 500 again employs many of the basic layout components of FIG. 3A as shown, and the discussion of these components with respect to FIG. 3A may also be applied to FIG. 5A. However, the capacitive component $C_{RE}$ is yet a different embodiment and will be the focus of discussion for FIGS. 5A and 5B. As before, FIG. 5B represents a sectioned view.

The illustrated embodiment of the capacitive component $C_{RE}$ provides a supplemental capacitance corresponding to a series-coupled capacitor 507 located in a metallization layer M1. The series-coupled capacitor 507 employs two capacitors to provide a supplemental capacitance. One side of each capacitor employs first conductive layers 512a, 522a respectively connected to the first drain D(310) and the second drain D(315) and the third drain D(320) and the fourth drain D(325) to form the first and second storage nodes A, B. Opposite sides of each capacitor 550a, 550b are connected together by a metallization 560 isolated within the metallization layer M1, as shown. Insulating layers 555a, 555b respectively provide electrical isolation between each side of the capacitors. As before, the series-coupled capacitor 507 provides a supplemental capacitance having a capacitance value equal to about half of each individual capacitor and is efficiently formed in the metallization layer M1.

Figure 6A:
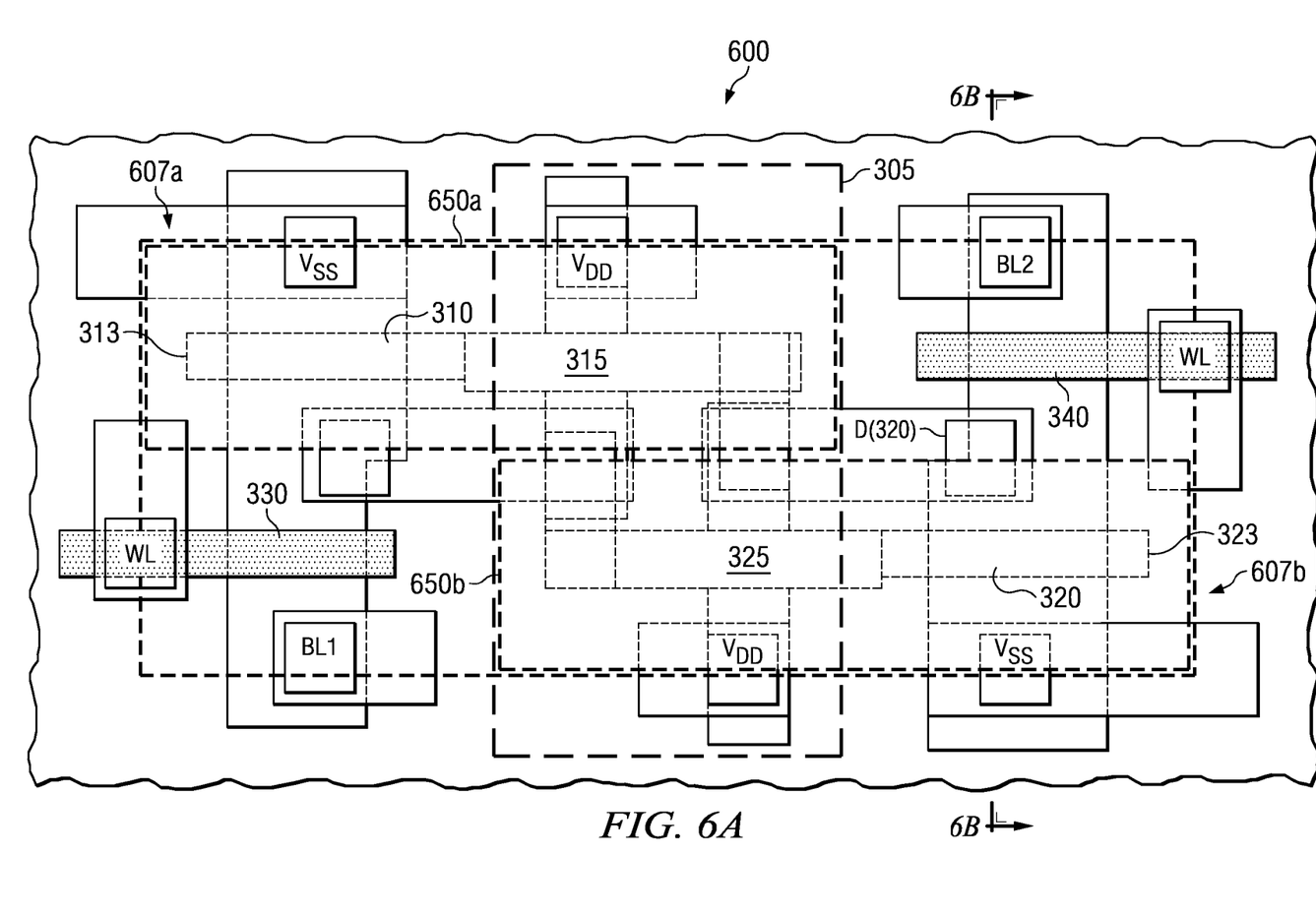
FIGS. 6A and 6B illustrate a physical layout corresponding to the 6T SRAM cell of FIG. 1 and employing still another embodiment of a capacitive component constructed according to the principles of present disclosure.
Figure 6B:
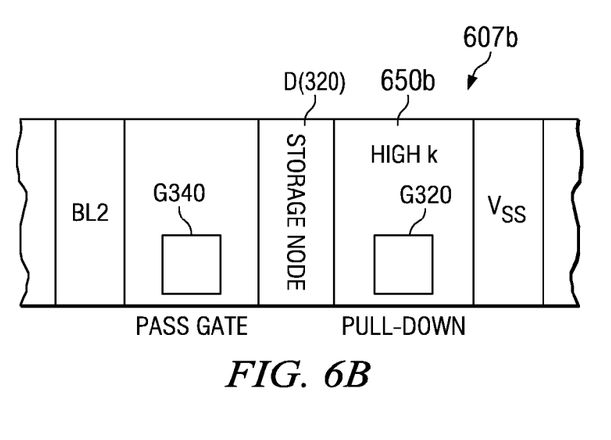

FIGS. 6A and 6B illustrate a physical layout 600 corresponding to the 6T SRAM cell 100 of FIG. 1 and employing still another embodiment of a capacitive component $C_{RE}$ constructed according to the principles of present disclosure. The physical layout 600 again employs many of the basic layout components of FIG. 3A as shown, and the discussion of these components with respect to FIG. 3A may also be applied to FIG. 6A. However, the capacitive component $C_{RE}$ is a still different embodiment and will be the focus of discussion for FIGS. 6A and 6B. As before, FIG. 6B represents a sectioned view. However, it may be noted that the sectioned view is taken in a different portion of the physical layout 600.

The illustrated embodiment of the capacitive component $C_{RE}$ provides a supplemental capacitance corresponding to an in situ capacitor 607 located between each of the first and second storage nodes A, B and their respective gate structures 313, 323. The in situ capacitor 607 consists of the parallel combination of first and second in situ capacitors 607a, 607b. Construction of the second in situ capacitor 607b (as typical) may more clearly be seen in FIG. 6B where a high dielectric constant pre-metal dielectric (PMD) layer 650b surrounds the second gate structure 323. Selection of a dielectric constant k is based on the supplemental capacitance required to provide a Read-before-upset (RBU) signal for the 6T SRAM cell 100 of FIG. 1.

Figure 7:
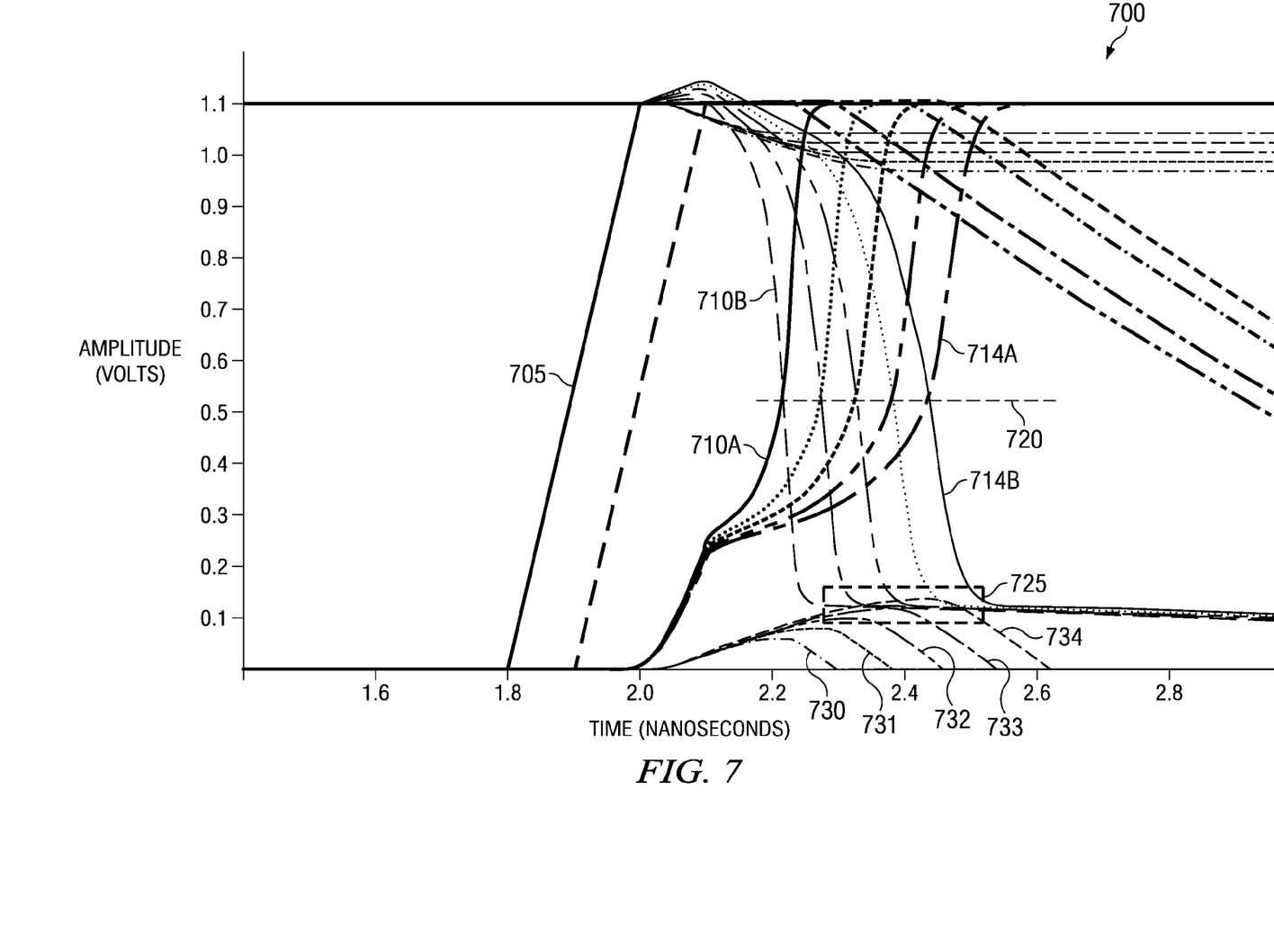
FIG. 7 illustrates waveforms 700 corresponding to the 6T SRAM cell of FIG. 1 and employing an embodiment of a capacitive component constructed according to the principles of present disclosure.

FIG. 7 illustrates waveforms 700 corresponding to the 6T SRAM cell 100 of FIG. 1 employing an embodiment of a capacitive component $C_{RE}$ and constructed according to the principles of the present disclosure. The waveforms 700 correspond to the 6T SRAM cell 100 having about 250 millivolts of added noise representing an imbalance in a direction opposing the initial state of the cell, a bit line capacitance of about 25 femtofarads (approximately 125 rows per column) and the capacitive component $C_{RE}$ ranging from zero to about 0.4 femtofarads.

Waveform 705 corresponds to the word line WL turning ON. Waveforms 710A through 714A correspond to the first storage node A, which starts in a low state and transitions to a high state during upset of the SRAM cell 100. Correspondingly, waveforms 710B through 714B correspond to the second storage node B, which starts in a high state and transitions to a low state during upset. Waveforms 710A and 710B represent a value of the capacitive component $C_{RE}$ equal to zero, and waveforms 714A and 714B represent a value of the capacitive component $C_{RE}$ equal to about 0.4 femtofarads. The line 720 indicates a region where the original memory state of the SRAM cell 100 has been lost (i.e., where the voltages of the initially HIGH and initially LOW storage nodes cross).

Waveforms 730 through 734 correspond to differential Read signals that occur between the first and second bit lines BL1, BL2 and indicate the memory state of the SRAM cell 100. It may be noted that each of these waveforms peaks where waveforms corresponding to the first and second storage nodes A, B cross, which is the region of the line 720. The waveform 730 corresponds to the capacitive component $C_{RE}$ having a value of zero and indicates the minimum differential read signal. If a measurement window 725 indicates minimum Read signal amplitudes and timing required to robustly read the memory state, then only the read signals corresponding to waveforms 733 and 734 qualify. These read signals respectively correspond to the capacitive component $C_{RE}$ providing supplemental capacitances of about 0.3 and 0.4 femtofarads.

Figure 8:
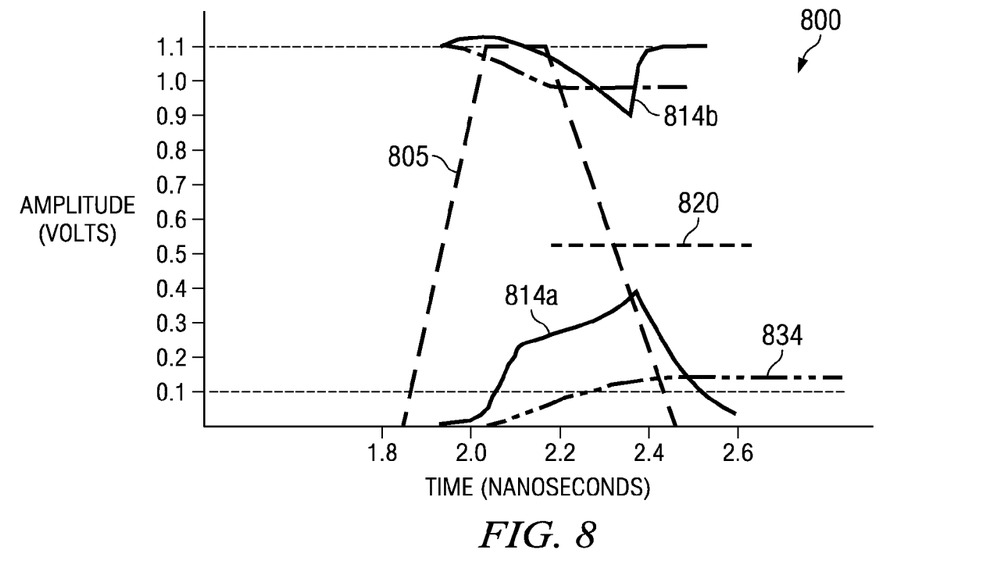
FIG. 8 illustrates alternative waveforms corresponding to the 6T SRAM cell of FIG. 1 employing an embodiment of a capacitive component $C_{RE}$ and constructed according to the principles of the present disclosure.

FIG. 8 illustrates alternative waveforms 800 corresponding to the 6T SRAM cell 100 of FIG. 1 employing an embodiment of a capacitive component $C_{RE}$ and constructed according to the principles of the present disclosure. The alternative waveforms 800 again correspond to the 6T SRAM cell 100 having about 250 millivolts of added noise representing an imbalance in a direction opposing the initial state of the cell, a bit line capacitance of about 25 femtofarads (approximately 125 rows per column) and the capacitive component $C_{RE}$ having a value of about 0.4 femtofarads.

Waveform 805 corresponds to the word line WL turning ON and then turning OFF in the form of a pulse, as shown. Waveform 814a corresponds to the first storage node A, which starts in a low state and transitions upward towards a high state during reading of the SRAM cell 100. Waveform 814b corresponds to the second storage node B, which starts in a high state and transitions towards a low state during reading of the SRAM cell 100. The line 820 indicates a region where the original memory state of the SRAM cell 100 would be lost (i.e., where the voltages of the initially HIGH and initially LOW storage nodes would cross). Waveform 834 corresponds to a differential Read signal that occurs between the first and second bit lines BL1, BL2 and indicates the memory state of the SRAM cell 100.

It may be noted that the waveforms 814a, 814b move towards the line 820 while the word line WL (waveform 805) is turned ON and reverse back to their original states when the word line WL is turned OFF thereby never reaching a state of memory upset. The capacitive component $C_{RE}$ having a value of about 0.4 femtofarads has prevented memory upset from occurring in the present embodiment; since discussions corresponding to FIG. 7 indicate that memory upset would have occurred especially for smaller or a zero value of supplemental capacitance. Additionally, the capacitive component $C_{RE}$ having a value of about 0.4 femtofarads has extended the read signal to about 200 picoseconds above 100 millivolts, as desired.

Figure 9:
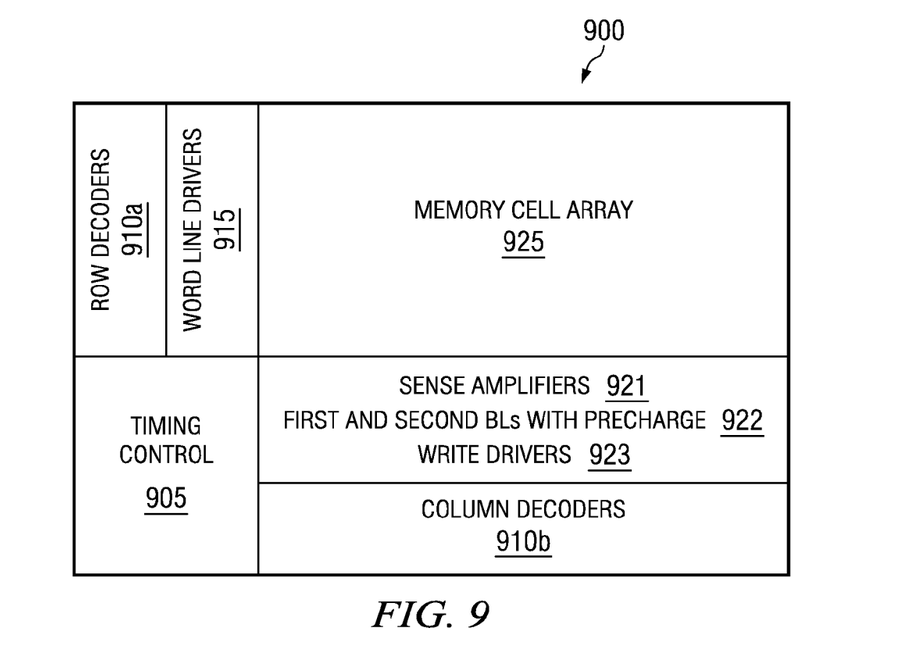
FIG. 9 illustrates a block diagram of an embodiment of an integrated circuit constructed according to the principles of the present invention.

FIG. 9 illustrates a block diagram of an embodiment of an integrated circuit 900 constructed according to the principles of the present invention. The integrated circuit 900 includes a timing control unit 905, row and column decoders 910a, 910b coupled to the timing control unit 905, word line drivers 915 coupled to the row decoders 910a, sense amplifiers 921, first and second bit lines with precharge circuits 922 and write drivers 923 coupled to the column decoders 910b and a memory cell array 925 having a memory cell, such as the 6T SRAM cell 100 of FIG. 1, corresponding to a bit position for each intersecting row and column.

The memory cell includes a pair of cross-connected CMOS inverters with first and second storage nodes. The memory cell also includes a capacitive component connected between the first and second storage nodes that provides a supplemental capacitance to extend a read signal for sensing a memory state of the inverters by the sense amplifiers 921. The memory cell also includes first and second pass-gate MOS transistors that are controlled by a corresponding one of the word line drivers and respectively connected between the first and second storage nodes and corresponding first and second bit lines 922.

In one embodiment, the corresponding first and second bit lines 922 are initially precharged and floated and the corresponding one of the word line drivers 915 is activated for sensing the memory state initially. Activation of the corresponding one of the word line drivers 915 provides a pulsed signal that deactivates before an initial memory state is upset. In this case, the supplemental capacitance is operational to impose a voltage on the corresponding first and second bit lines that allows sensing the initial memory state of the memory cell. This is accomplished in some cases while avoiding upset of the memory state, or prior to the initial memory state being upset, in other cases.

In an additional embodiment, the supplemental capacitance is adjusted in value corresponding to a dynamic voltage interaction between one of the first and second bit lines 922 and the first or second storage node of the memory cell to provide a sensing signal on the corresponding bit line for determining an initial memory state of the memory element prior to the initial memory state being upset. Alternatively, the supplemental capacitance may be adjusted in value corresponding to a number of rows on a column to provide a sensing signal on the corresponding bit line for determining an initial memory state of the memory cell prior to the initial memory state being upset.

Figure 10:
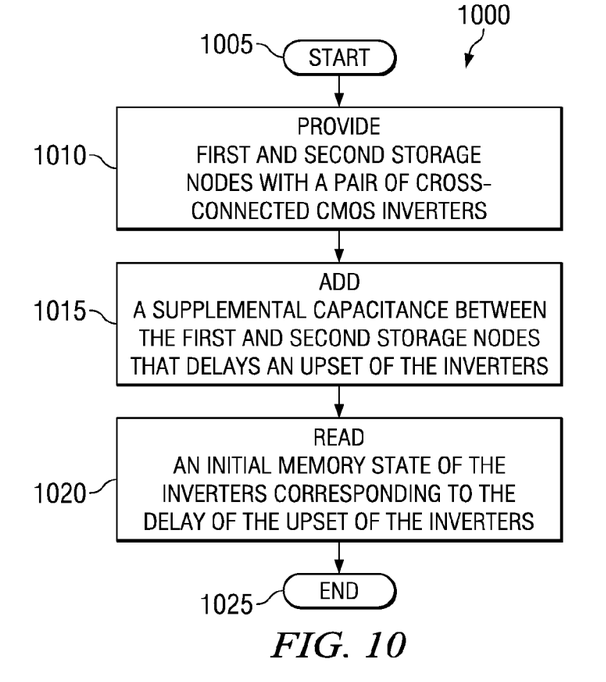
FIG. 10 illustrates a flow diagram of an embodiment of a method of constructing a memory element carried out according to the principles of the present disclosure.

FIG. 10 illustrates a flow diagram of an embodiment of a method 1000 of constructing a memory element carried out according to the principles of the present disclosure. The method 1000 starts in a step 1005 and provides first and second storage nodes with a pair of cross-connected CMOS inverters, in a step 1010. Then, in a step 1015, a supplemental capacitance is added between the first and second storage nodes that delays an upset of the inverters. An initial memory state of the inverters is read corresponding to the delay of the upset of the inverters, in a step 1020.

In one embodiment, the supplemental capacitance corresponds to a single capacitor having first and second conductive layers respectively connected between the first and second storage nodes through first and second metallization layers located over the first and second storage nodes. In another embodiment, the supplemental capacitance corresponds to a series-coupled capacitor located in a metallization layer, having one side of each of two capacitors respectively connected to the first and second storage nodes and opposite sides connected together by a metallization isolated within the metallization layer.

In an alternative embodiment, the supplemental capacitance corresponds to a series-capacitance structure having first and second metallization portions within a metallization layer respectively connected to the first and second storage nodes and a common conductive layer constructed over the metallization layer that is electrically insulated from the first and second metallization portions. Additionally, the supplemental capacitance corresponds to a series-capacitance structure located in a metallization layer, having first and second conductive layers respectively connected to the first and second storage nodes and a common conductive layer constructed to be electrically insulated over the first and second conductive layers.

In yet another embodiment, the supplemental capacitance corresponds to an in situ capacitor located between one of the storage nodes and its corresponding gate structure having a surrounding pre-metal dielectric layer with a dielectric constant selected to provide a required capacitance. The method 1000 ends in a step 1025.

Figure 11:
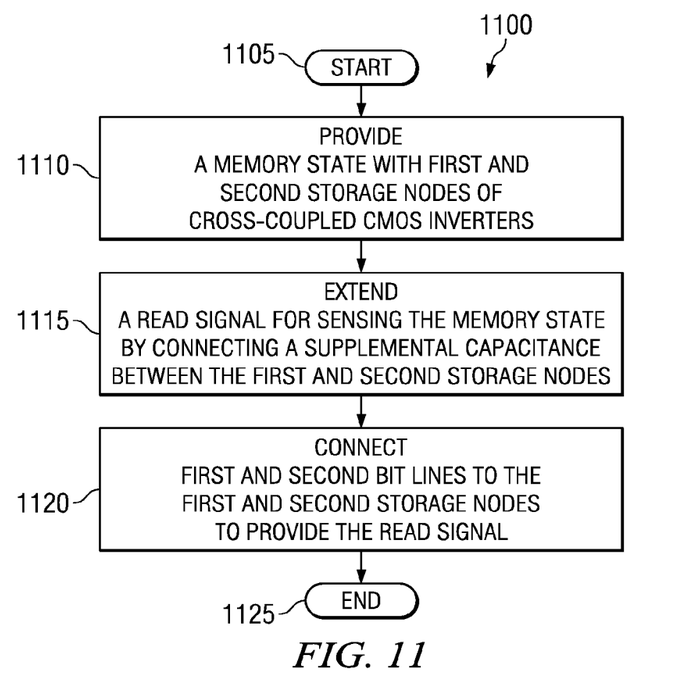
FIG. 11 illustrates a flow diagram of an embodiment of a method of operating a memory element carried out according to the principles of the present disclosure.

FIG. 11 illustrates a flow diagram of an embodiment of a method 1100 of operating a memory element carried out according to the principles of the present disclosure. The method 1100 starts in a step 1105 and provides a memory state with first and second storage nodes of cross-coupled CMOS inverters in a step 1110. Then, in a step 1115, a read signal is extended for sensing the memory state by connecting a supplemental capacitance between the first and second storage nodes. First and second bit lines are connected to the first and second storage nodes to provide the read signal, in a step 1120.

In one embodiment, the supplemental capacitance ranges from about one to two percent of an associated bit line capacitance and extends the read signal to permit sensing the memory state prior to the memory state being upset. The supplemental capacitance extends the read signal corresponding to at least one of signal duration and signal amplitude wherein the signal duration and amplitude provide a period of at least 100 picoseconds above a level of 100 millivolts, in one embodiment. Additionally, the supplemental capacitance extends the read signal based on activation of an associated word line and subsequent deactivation of the associated word line while sensing the memory state. Alternatively, the supplemental capacitance extends the read signal based on using a pulsed word line. The method 1100 ends in a step 1125.

Those skilled in the art to which the disclosure relates will appreciate that other and further additions, deletions, substitutions and modifications may be made to the described example embodiments without departing from the disclosure. For example, the invention may be applied to other memories that include cross-coupled inverters as a storage element (e.g., an eight transistor cell or a dual port cell).

What is claimed is:

1. A memory element, comprising:
 a pair of cross-connected CMOS inverters having first and second storage nodes; and
 a capacitive component connected between the first and second storage nodes and configured to provide a supplemental capacitance to extend a read signal for sensing a memory state of the inverters;
 wherein the supplemental capacitance extends the read signal corresponding to at least one of a signal duration and a signal amplitude.

2. The memory element as recited in claim 1 wherein the supplemental capacitance extends the read signal to permit sensing the memory state prior to the memory state being upset.

3. The memory element as recited in claim 1 wherein the signal duration and amplitude provide a period of at least 100 picoseconds above a level of 100 millivolts.

4. The memory element as recited in claim 1 wherein the supplemental capacitance extends the read signal based on activation of an associated word line and subsequent deactivation of the associated word line while sensing the memory state.

5. The memory element as recited in claim 1 wherein the supplemental capacitance ranges from about one to two percent of an associated bit line capacitance.

6. The memory element as recited in claim 1 wherein the supplemental capacitance corresponds to a single capacitor having first and second conductive layers respectively connected between the first and second storage nodes through first and second metallization layers located over the first and second storage nodes.

7. The memory element as recited in claim 1 wherein the supplemental capacitance corresponds to a series-capacitance structure having first and second metallization portions within a metallization layer respectively connected to the first and second storage nodes and a common conductive layer constructed over the metallization layer that is electrically insulated from the first and second metallization portions.

8. The memory element as recited in claim 1 wherein the supplemental capacitance corresponds to a series-capacitance structure located in a metallization layer, having first and second conductive layers respectively connected to the first and second storage nodes and a common conductive layer constructed to be electrically insulated over the first and second conductive layers.

9. The memory element as recited in claim 1 wherein the supplemental capacitance corresponds to a series-coupled capacitor located in a metallization layer, having one side of each of two capacitors respectively connected to the first and second storage nodes and opposite sides connected together by a metallization isolated within the metallization layer.

10. The memory element as recited in claim 1 wherein the supplemental capacitance corresponds to an in situ capacitor located between one of the storage nodes and its corresponding gate structure having a surrounding pre-metal dielectric layer with a dielectric constant selected to provide a required capacitance.

11. A method of constructing a memory element, comprising:
 providing first and second storage nodes with a pair of cross-connected CMOS inverters; and
 adding a supplemental capacitance between the first and second storage nodes that delays an upset of the inverters to allow reading an initial memory state of the inverters;

wherein the supplemental capacitance extends the read signal corresponding to at least one of a signal duration and a signal amplitude.

12. The method as recited in claim 11 wherein the supplemental capacitance corresponds to a single capacitor having first and second conductive layers respectively connected between the first and second storage nodes through first and second metallization layers located over the first and second storage nodes.

13. The method as recited in claim 11 wherein the supplemental capacitance corresponds to a series-capacitance structure having first and second metallization portions within a metallization layer respectively connected to the first and second storage nodes and a common conductive layer constructed over the metallization layer that is electrically insulated from the first and second metallization portions.

14. The method as recited in claim 11 wherein the supplemental capacitance corresponds to a series-capacitance structure located in a metallization layer, having first and second conductive layers respectively connected to the first and second storage nodes and a common conductive layer constructed to be electrically insulated over the first and second conductive layers.

15. The method as recited in claim 11 wherein the supplemental capacitance corresponds to a series-coupled capacitor located in a metallization layer, having one side of each of two capacitors respectively connected to the first and second storage nodes and opposite sides connected together by a metallization isolated within the metallization layer.

16. The method as recited in claim 11 wherein the supplemental capacitance corresponds to an in situ capacitor located between one of the storage nodes and its corresponding gate structure having a surrounding pre-metal dielectric layer with a dielectric constant selected to provide a required capacitance.

17. A method of operating a memory cell, comprising:
providing a memory state with first and second storage nodes of cross-coupled CMOS inverters; and
extending a read signal for sensing the memory state by connecting a supplemental capacitance between the first and second storage nodes; and
connecting first and second bit lines to the first and second storage nodes to provide the read signal;
wherein the supplemental capacitance extends the read signal corresponding to at least one of a signal duration and a signal amplitude.

18. The method as recited in claim 17 wherein the supplemental capacitance extends the read signal to permit sensing the memory state prior to the memory state being upset.

19. The method as recited in claim 17 wherein the signal duration and amplitude provide a period of at least 100 picoseconds above a level of 100 millivolts.

20. The method as recited in claim 17 wherein the supplemental capacitance extends the read signal based on activation of an associated word line and subsequent deactivation of the associated word line while sensing the memory state.

21. The method as recited in claim 17 wherein the supplemental capacitance ranges from about one to two percent of an associated bit line capacitance.

22. An SRAM cell, comprising:
a memory element, including:
a pair of cross-connected CMOS inverters having first and second storage nodes, and
a capacitive component connected between the first and second storage nodes that provides a supplemental capacitance to extend a read signal for sensing a memory state of the inverters; and
first and second pass-gate MOS transistors that are controlled by a word line and respectively connected between the first and second storage nodes and first and second bit lines;
wherein the supplemental capacitance extends the read signal corresponding to at least one of a signal duration and a signal amplitude.

23. The SRAM cell as recited in claim 22 wherein the supplemental capacitance extends the read signal to permit sensing the memory state prior to the memory state being upset.

24. The SRAM cell as recited in claim 22 wherein the signal duration and amplitude provide a period of at least 100 picoseconds above a level of 100 millivolts.

25. The SRAM cell as recited in claim 22 wherein the supplemental capacitance extends the read signal based on activation of the word line and subsequent deactivation of the word line while the first and second bit lines are sensing the memory state.

26. The SRAM cell as recited in claim 22 wherein the supplemental capacitance ranges from about one to two percent of an associated bit line capacitance.

27. The SRAM cell as recited in claim 22 wherein the supplemental capacitance corresponds to a single capacitor having first and second conductive layers respectively connected between the first and second storage nodes through first and second metallization layers located over the first and second storage nodes.

28. The SRAM cell as recited in claim 22 wherein the supplemental capacitance corresponds to a series-capacitance structure having first and second metallization portions within a metallization layer respectively connected to the first and second storage nodes and a common conductive layer constructed over the metallization layer that is electrically insulated from the first and second metallization portions.

29. The SRAM cell as recited in claim 22 wherein the supplemental capacitance corresponds to a series-capacitance structure located in a metallization layer, having first and second conductive layers respectively connected to the first and second storage nodes and a common conductive layer constructed to be electrically insulated over the first and second conductive layers.

30. The SRAM cell as recited in claim 22 wherein the supplemental capacitance corresponds to a series-coupled capacitor located in a metallization layer, having one side of each of two capacitors respectively connected to the first and second storage nodes and opposite sides connected together by a metallization isolated within the metallization layer.

31. The SRAM cell as recited in claim 22 wherein the supplemental capacitance corresponds to an in situ capacitor located between one of the storage nodes and its corresponding gate structure having a surrounding pre-metal dielectric layer with a dielectric constant selected to provide a required capacitance.

32. An integrated circuit, comprising:
a timing control unit;
row and column decoders coupled to the timing control unit;
word line drivers coupled to the row decoders;
sense amplifiers, first and second bit lines with precharge circuits and write drivers coupled to the column decoders; and
a memory cell array having a memory cell corresponding to a bit position for each intersecting row and column, including:
a pair of cross-connected CMOS inverters with first and second storage nodes, a capacitive component connected between the first and second storage nodes that provides a supplemental capacitance to extend a read signal for sensing a memory state of the inverters by the sense amplifiers, and first and second pass-gate MOS transistors that are controlled by a corresponding one of the word line drivers and respectively connected between the first and second storage nodes and corresponding first and second bit lines;

wherein the supplemental capacitance extends the read signal corresponding to at least one of a signal duration and a signal amplitude.

33. The integrated circuit as recited in claim 32 wherein the supplemental capacitance is operational to impose a voltage on the corresponding first and second bit lines that allows sensing an initial memory state of the memory cell prior to the initial memory state being upset.

34. The integrated circuit as recited in claim 33 wherein the corresponding first and second bit lines are initially precharged and floated and the corresponding one of the word line drivers is activated for sensing the initial memory state.

35. The integrated circuit as recited in claim 32 wherein the corresponding one of the word line drivers provides a pulsed signal that deactivates before an initial memory state is upset.

36. The integrated circuit as recited in claim 32 wherein the supplemental capacitance is operational to prevent an initial memory state from being upset for a memory cell that is subject to memory cell upset when corresponding first and second bit lines are initially precharged and floated and a corresponding one of the word line drivers is activated.

37. The integrated circuit as recited in claim 32 wherein the supplemental capacitance is adjusted in value corresponding to a dynamic voltage interaction between a corresponding bit line and storage node of the memory cell to provide a sensing signal on the bit line for determining an initial memory state of the memory element prior to the initial memory state being upset.

38. The integrated circuit as recited in claim 32 wherein the supplemental capacitance is adjusted in value corresponding to a number of rows on a column to provide a sensing signal on a bit line for determining an initial memory state of the memory cell prior to the initial memory state being upset.

* * * * *